United States Patent [19]

Aso et al.

[11] 4,326,210
[45] Apr. 20, 1982

[54] LIGHT-RESPONSIVE FIELD EFFECT MODE SEMICONDUCTOR DEVICES

[75] Inventors: Akira Aso, Nara; Hitoshi Kawanabe, Tenri, both of Japan

[73] Assignee: Sharp Kabushiki Kaisha, Osaka, Japan

[21] Appl. No.: 149,258

[22] Filed: May 12, 1980

Related U.S. Application Data

[63] Continuation of Ser. No. 945,918, Sep. 26, 1978, abandoned.

[30] Foreign Application Priority Data

Sep. 26, 1977 [JP] Japan .............................. 52-116209

[51] Int. Cl.³ .............................................. H01L 29/80
[52] U.S. Cl. .......................................... 357/22; 357/30
[58] Field of Search ........................... 357/22, 23, 30

[56] References Cited

U.S. PATENT DOCUMENTS

| | | | |
|---|---|---|---|
| 3,894,295 | 7/1975 | Shannon | 357/22 X |
| 3,931,633 | 1/1976 | Shannon | 357/22 X |
| 4,115,793 | 9/1978 | Nishizawa | 357/22 |

*Primary Examiner*—Martin H. Edlow
*Attorney, Agent, or Firm*—Birch, Stewart, Kolasch & Birch

[57] ABSTRACT

A field effect semiconductor device comprises a P-N junction with a depletion layer responsive to radiant energy for controllably enabling the field effect semiconductor device. The depletion layer occurs near at least a pair of gate locations within a silicon substrate. The gate locations are of P-type while the silicon substrate is of N-type. The depletion layer is rendered ineffective by photoelectromotive force derived from the radiant energy. A channel emerges according to the shrinkage of the depletion layer to thereby provide electrical connection between a source and drain electrodes of the field effect transistor.

6 Claims, 6 Drawing Figures

LIGHT-RESPONSIVE FIELD EFFECT MODE SEMICONDUCTOR DEVICES

This application is a continuation, of copending application Ser. No. 945,918, filed on Sept. 26, 1978, now abandoned.

BACKGROUND OF THE INVENTION

1. Field of the Invention

The present invention relates to light-responsive field effect mode semiconductor devices and, more particularly, to such semiconductor devices, of which the widening effects of a depletion layer are controlled by photoelectromotive force to thereby control the presence and absence of a channel between source and drain electrodes therein. Upon application of radiant energy the channel emerges while the depletion layer disappears. Electric signals are taken off from the opposing sides of the semiconductor device.

2. Description of the Prior Art

A conventional device responsive to photo energy, essentially comprises a semiconductor device for converting radiant energy to electric signals and another semiconductor device for developing output signals by the electric signals. Even if the conventional device is incorporated into a same semiconductor chip, a considerable large area of the semiconductor chip is unavoidably required because of the semiconductor devices needed.

OBJECTS AND SUMMARY OF THE INVENTION

Accordingly, it is the primary object of the present invention to provide a new compact field effect mode semiconductor device which is responsive to radiant energy and develops electric signals.

It is another object of the present invention to provide a new compact field effect mode semiconductor device where the presence or absence of a depletion layer of the field effect mode semiconductor device is controlled by photo electromotive force which is produced at the boundary of a P-N junction in response to radiant energy.

The depletion layer controls the presence or absence of a channel between a source and drain electrodes of the field effect mode semiconductor device.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, at least a pair of gate locations are incorporated into a surface layer of a compact field effect mode semiconductor device of the present invention. A channel between a source and drain electrodes of the field effect mode semiconductor device emerges at an interval between the pair of gate locations when the field effect mode semiconductor device is energized. Photoelectromotive force is brought out by radiant energy at a P-N junction of the P-type gate locations and the N-type surface layer. The photoelectromotive force eliminates the extension effects of a depletion layer formed by the gate location and the surface layer. The absence of depletion layer permits the channel to emerge and thereby provide electrical connection between the source and drain electrodes.

The gate location may have an electrode where electrical signals are applied to control the extention of the depletion layer together with the photo energy.

When the radiant energy is removed, the field effect mode semiconductor device is prevented from being enabled.

BRIEF DESCRIPTION OF THE DRAWINGS

The present invention will become more fully understood from the detailed description given hereinbelow and the accompanying drawings which are given by way of illustration only, and thus are not limitative to the present invention and wherein.

DESCRIPTION OF THE PREFERRED EMBODIMENTS

Figure 1A:
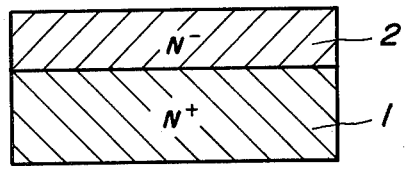
FIGS. 1(A) and 1(B) are cross-sectional views of semiconductor chips adapted to a field effect mode semiconductor device of the present invention.
Figure 1B:
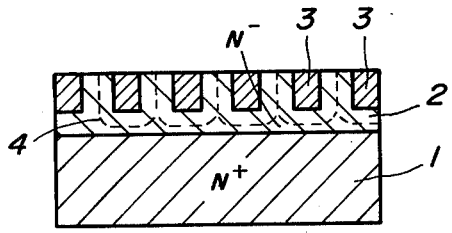

FIGS. 1(A) and 1(B) show semiconductor chips adapted to a field effect mode semiconductor device of the present invention in sectional views. A silicon substrate denoted as 1 is of $N^+$-type by diffusing suitable impurities. A surface layer 2 is formed on the silicon substrate 1 and is of $N^-$-type to assure high resistant properties.

At least a pair of gate locations of P-type denoted as 3 is formed within the substrate layer 2 by a conventional diffusion process. The gate locations 3 are positioned so as to oppose to each other. A channel may emerge within the surface layer 2 between the gate locations 3. However, the channel is prevented from being produced by a depletion layer 4 because the depletion layer 4 occupies the total interval between the gate locations as best shown in FIG. 1(B) while radiant energy is not present. The depletion layer 4 is formed by a P-N junction of the P-type gate location 3 and the N-type surface layer 2.

Figure 1C:
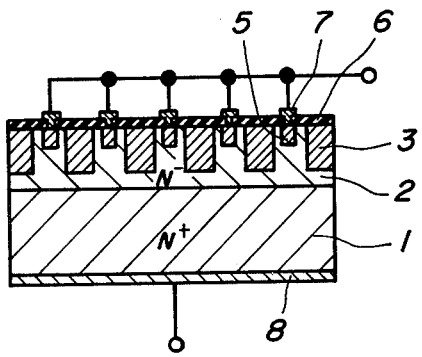

FIG. 1(C) shows a field effect mode semiconductor device of the present invention wherein a plurality of a source locations 5 of $N^+$-type are formed within the surface layer 2 beside the gate locations 3. An insulating layer 6 is disposed on the gate locations 3 and the surface layer 2 except for the source location 5. A plurality of source electrodes 7 are connected to the source locations 5, respectively. A drain electrode 8 is disposed on the silicon substrate 1.

A thickness X of the depletion layer can be written by the following equation (1) in a general semiconductor device with the P-N junction.

$$X = \frac{\sqrt{2\epsilon(VO + V)}}{qN} \quad (1)$$

An open voltage VOP in a solar battery comprising the P-N junction can be represented by the following equation (2).

$$VOP = \frac{KT}{q} l_n \left( \frac{IL}{IS} + 1 \right) \quad (2)$$

where
ε is dielectric constant of semiconductor material adapted to the semiconductor device, q is a charge of an electron,
N is carrier density of a high resistant side of the semiconductor device, V0 is potential difference of the diffusion potential between the P-N junction in the semiconductor device, V is an applied voltage, K is Boltzmann constant,
T is absolute temperature, IL is photoelectric current and IS is diode suturation current for the solar battery.

When the field effect mode semiconductor device of the present invention shown in FIG. 1(C) is not excited by radiant energy, the depletion layers 4 extend around the gate locations 3 as shown in FIG. 1(B) in accordance with the potential difference V0 of the diffusion potential in the equation (1). The channel is broken by the enlarging depletion layers 4 to thereby remain isolating the source electrode 7 and the drain electrode 8 from each other.

Figure 4:
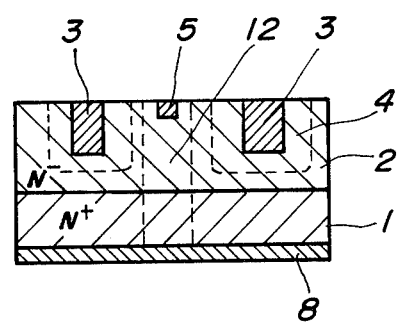
FIG. 4 is a cross-sectional view of a field effect mode semiconductor device showing its enabling conditions.

When the radiant energy is impressed on the field effect mode semiconductor device, especially, on the surface layer 2 beside the gate locations 3, the open voltage VOP is produced in the P-N junction between the gate location 3 and the surface layer 2 in a forward direction to thereby reduce the depletion layer 4 as best shown in FIG. 4. Therefore, as illustrated in FIG. 4, the channel 12 is eventually produced within both the surface layer 2 along the gate locations 3 and the silicon substrate 1. The source electrode 7 is electrically connected to the drain electrode 8 through the channel 12. Channel currents can be controlled by the irradiation of the device radiant energy. The channel currents may be influenced by the scale of the gate locations 3.

Figure 2:
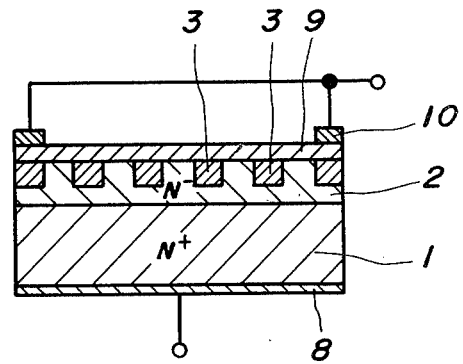
FIGS. 1(C), 2 and 3 are cross-sectional views of field effect mode semiconductor device of the present invention.

FIG. 2 illustrates another preferred form of the field effect mode semiconductor device of the present invention where this is the same as FIG. 1(C) except that a source location 9 of N+-type is disposed substantially on the surface layer 2 with the gate locations 3. The diffusion of N-type impurities into the source location 9 is selected shallower than in the gate locations 3. The P-type gate locations 3 settle down completely within the surface layer 2. A source electrode 10 is connected to the source location 9.

Figure 3:
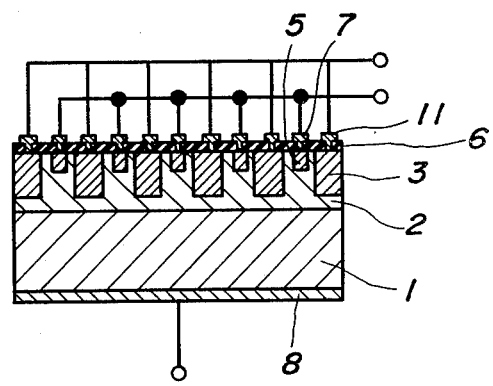

FIG. 3 depicts still another preferred form of the field effect mode semiconductor device of the present invention where this is the same as FIG. 1(C) except that a plurality of gate electrodes 11 are coupled to respective gate locations 3. Gate signals are applied to the gate electrodes 11 so that they can compensate for the shortage of the radiant energy sufficient for enabling the field effect mode semiconductor device or they can control the field effect mode semiconductor device.

When the radiant energy is removed, the field effect mode semiconductor device is turned inoperative due to the absence of the channel 12.

As described above, in accordance with the present invention, a compact and multi-functional field effect mode semiconductor device is derived which is available for high applied voltage. A source and drain electrodes are connected at the opposing sides of the field effect mode semiconductor device so that leads for the source and drain electrodes are readily disposed with accuracy.

The invention being thus described, it will be obvious that the same may be varied in many ways. Such variations are not to be regarded as a departure from the spirit and scope of the invention, and all such modifications are intended to be included within the scope of the following claims.

What is claimed is:
1. A radiant energy responsive field effect mode semiconductor device comprising:
  a semiconductor substrate;
  a source region disposed in said substrate;
  a drain region disposed on said substrate;
  at least a pair of gate regions formed on said substrate between said source region and said drain region each of said pair of gate regions producing a juxtaposed depletion region between said pair of gate regions in said substrate in the absence of excitation, said depletion region pinching off the current between said drain regions;
  said depletion regions contracting in response to application of radiant energy to said substrate to allow current to flow from said source region to drain region.

2. The radiant energy responsive field effect mode semiconductor device of claim 1, wherein said pair of gate regions is made of P-type while said substrate is made of N-type.

3. The radiant energy responsive field effect mode semiconductor device according to claim 1, further comprising gate electrodes, said electrodes carrying electric signals to said gate regions.

4. A radiant energy responsive field effect mode semiconductor device according to claim 1, wherein the thickness X of said depletion layer varies in accordance with the following equation, $$X = \frac{\sqrt{2\epsilon (VO + V)}}{qN}$$

where ε dielectric constant of a semiconductor material adapted to said semiconductor device, q is a charge of an electron, N is carrier density of a high resistant side of said semiconductor device, V0 is potential difference of a diffusion potential between the P-N junction in said semiconductor device, and V is an applied voltage between said P-N junction.

5. The semiconductor device of claim 1 wherein said substrate has first and second planar surfaces;
  wherein said source is disposed on said first planar surface and said drain is disposed on said second planar surface; and
  wherein said current flows in a direction substantially perpendicular to said first planar surface.

6. The semiconductor device of claim 1 wherein said depletion layers overlap each other in the absence of excitation.

* * * * *